(12) United States Patent  
Lamprecht et al.

(10) Patent No.: US 7,389,015 B1
(45) Date of Patent: Jun. 17, 2008

(54) MECHANICALLY DECOUPLED OPTO-MECHANICAL CONNECTOR FOR FLEXIBLE OPTICAL WAVEGUIDES EMBEDDED AND/OR ATTACHED TO A PRINTED CIRCUIT BOARD

(75) Inventors: Tobias P. Lamprecht, Berneck (CH); Roger F. Dangel, Zug (CH); Folkert Horst, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/877,859

(22) Filed: Oct. 24, 2007

(51) Int. Cl.
*G02B 6/12* (2006.01)
(52) U.S. Cl. .............. 385/14; 385/49; 385/52; 385/53; 385/129; 385/130; 385/131
(58) Field of Classification Search .......... 385/14, 385/92, 52, 31, 49, 76, 77, 88, 89, 94, 129, 385/130, 131, 53, 50, 58, 101, 146; 438/22, 438/31; 257/432, 728
See application file for complete search history.

(56) References Cited

U.S. PATENT DOCUMENTS

| 6,069,991 | A | * | 5/2000 | Hibbs-Brenner et al. ...... 385/50 |
| 6,709,607 | B2 | * | 3/2004 | Hibbs-Brenner et al. ...... 216/24 |
| 7,112,885 | B2 | * | 9/2006 | Chen et al. ................... 257/728 |
| 7,213,974 | B2 | | 5/2007 | Kiani et al. |
| 2003/0180006 | A1 | * | 9/2003 | Loh et al. ..................... 385/88 |
| 2004/0218848 | A1 | | 11/2004 | Shen et al. |
| 2005/0201707 | A1 | * | 9/2005 | Glebov et al. ............... 385/132 |
| 2007/0205479 | A1 | | 9/2007 | Dangel et al. |

* cited by examiner

*Primary Examiner*—Brian M Healy
(74) *Attorney, Agent, or Firm*—Cantor Colburn LLP; Peter Klett

(57) ABSTRACT

Printed circuit boards that include optical interconnects include a flexible optical waveguide embedded or locally attached to the board having at least one end mechanically decoupled from the board during fabrication that can be fitted with a mechanical connector. Also disclosed are processes for fabricating the circuit board.

3 Claims, 5 Drawing Sheets

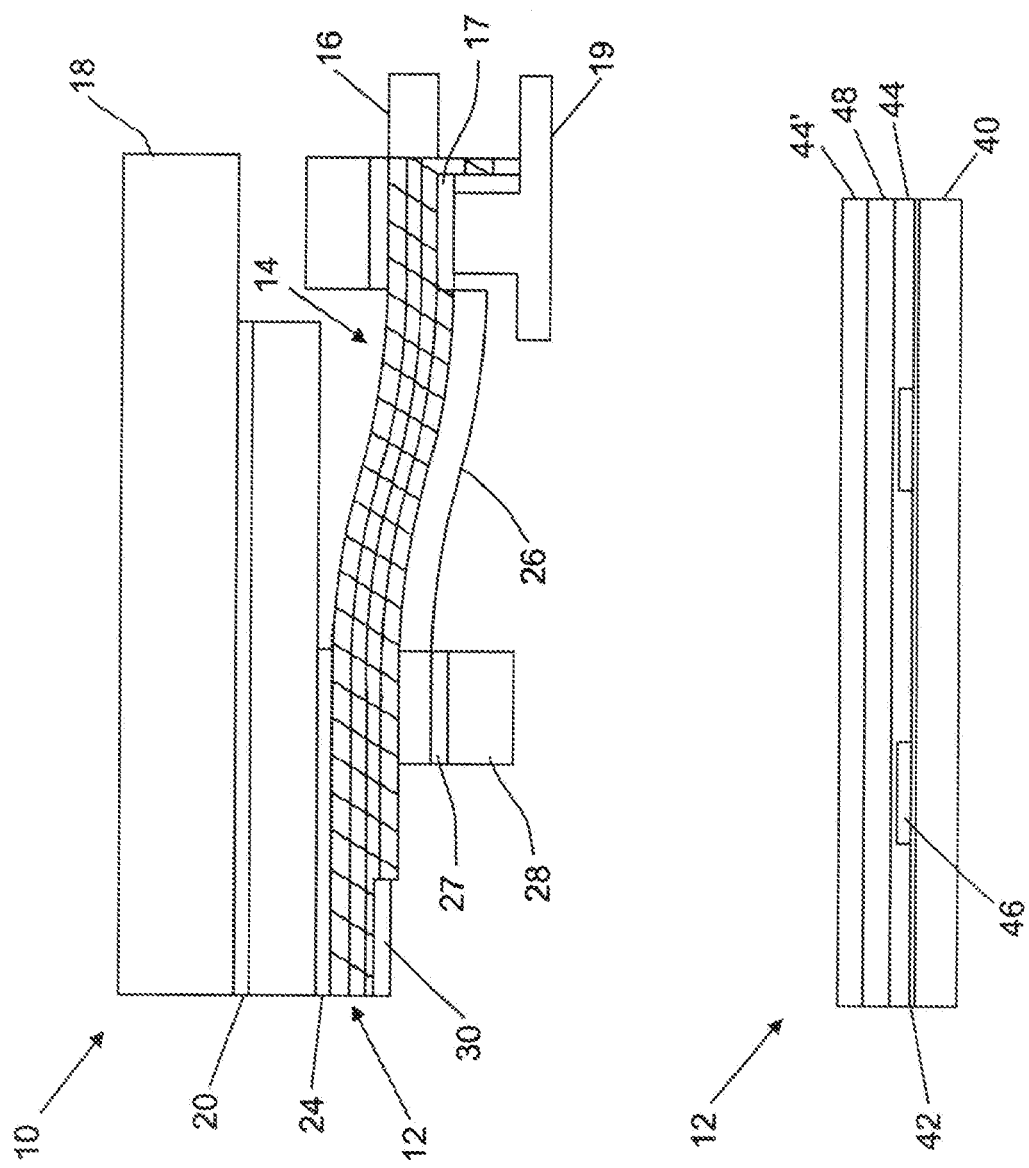

MECHANICALLY DECOUPLED OPTO-MECHANICAL CONNECTOR FOR FLEXIBLE OPTICAL WAVEGUIDES EMBEDDED AND/OR ATTACHED TO A PRINTED CIRCUIT BOARD

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention generally relates to mechanically decoupled opto-mechanical connectors for flexible optical waveguides embedded and/or attached to a printed circuit board. More particularly, the invention relates to improvements of an optical interface between the waveguides in an optical printed circuit board and associated opto-electronics or passive optics thereon.

2. Description of Background

Printed circuit boards (PCBs) generally include multiple integrated circuits mounted upon their surfaces. PCBs typically contain multiple conductive and dielectric layers interposed upon each other, and interlayer conductive paths (referred to as vias), which may extend from an integrated circuit mounted on a surface of the PCB to one or more conductive layers embedded within the PCB.

The speed and complexity of integrated circuits are increasing rapidly. As the number of components per chip, the number of chips per board, the modulation speed and the degree of integration continue to increase, electrical interconnects are facing fundamental limitations in areas such as bandwidth, bandwidth density, bandwidth times length product, packaging, and power consumption.

The employment of optical interconnects will be one of the major alternatives for upgrading the interconnection speed whenever conventional electrical interconnection fails to provide the required bandwidth. However, the introduction of optics and the required optical connections into the PCB causes problems due to the substantially different requirements than those of commonly utilized electrical interconnects, mechanical connectors, thermal interfaces, and the like. One problem is the proper connection of the waveguides in the board with waveguides in other boards, with opto-electronic modules on board, and with test equipment such as fiber bundles. For example, connections between the opto-electronic subassembly and the PCB would require electrical lines with high speed capability to the PCB, an optical coupling to the waveguides, mechanical connectors between the opto-electronic subassembly and the PCB as well as a thermal interface to the heat sink. Connections between boards would require optical connections with precise alignment, electrical lines, and rugged mechanical connections. Connection between the board and the test equipment would require optical connection with precise alignment and compatibility to standard fiber bundles. The different connections as noted above and the specific properties required for the connections, i.e., electrical, thermal (different coefficients of thermal expansion between dissimilar materials), and the like as well as the large tolerances in current PCB manufacturing processes, lead to numerous potential problems. For efficient optical coupling, the alignment accuracy of multimode polymer waveguides has to be in the range of 5 to 10 micrometers, whereas current PCB tolerances are in the range of about 100 micrometers.

Accordingly, there remains a need for improvement of the optical interface between an opto-enhanced printed circuit board and associated electronics thereon.

SUMMARY OF THE INVENTION

The shortcomings of the prior art are overcome and additional advantages are provided through the fabrication of a printed circuit board including optical interconnects comprising a rigid substrate; a flexible optical waveguide locally attached to the rigid substrate having at least one end mechanically decoupled from the rigid substrate such that the one end can be flexed away from the rigid substrate and fitted with a mechanical connector; and an optical facet incorporated in the mechanical connector enabling an optical coupling to the one end mechanically decoupled from the rigid substrate.

The printed circuit board (PCB) provides for mechanical decoupling of the optical connector from a rigid substrate, wherein the electrical connection between the PCB and the opto-electronic subassembly can be rigid or flexible. By way of example, a rigid connection can be an opto-electronic module directly attached with a ceramic carrier that is mounted onto the PCB. A flexible connection is provided that introduces electrical flex as a connection between the PCB and the opto-electronic module. As a result, mechanical stress is minimized and increased versatility is achieved.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates a sectional view of a printed circuit board including a flexible optical waveguide that is locally attached to the board and having a least one end mechanically decoupled from the rigid substrate and fitted with a mechanical connector;

FIG. 2 illustrates a sectional view of an exemplary flexible optical waveguide;

DETAILED DESCRIPTION OF THE INVENTION

Figure 3A:
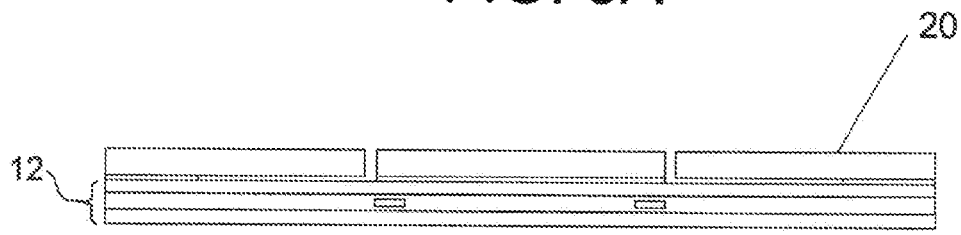
FIG. 3 (A-E) illustrates a process for fabricating the printed circuit board of FIG. 1.
Figure 3B:
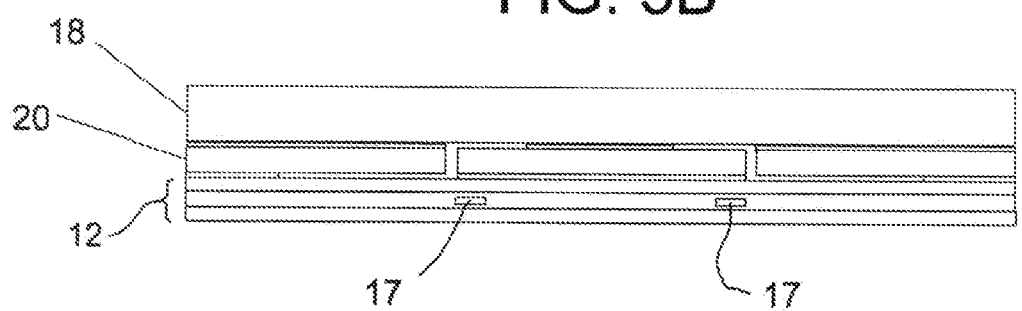
Figure 3C:
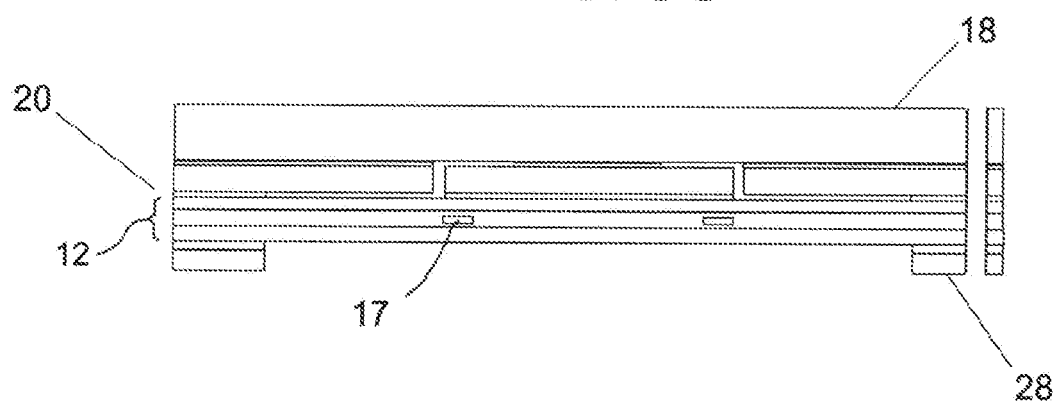
Figure 3D:
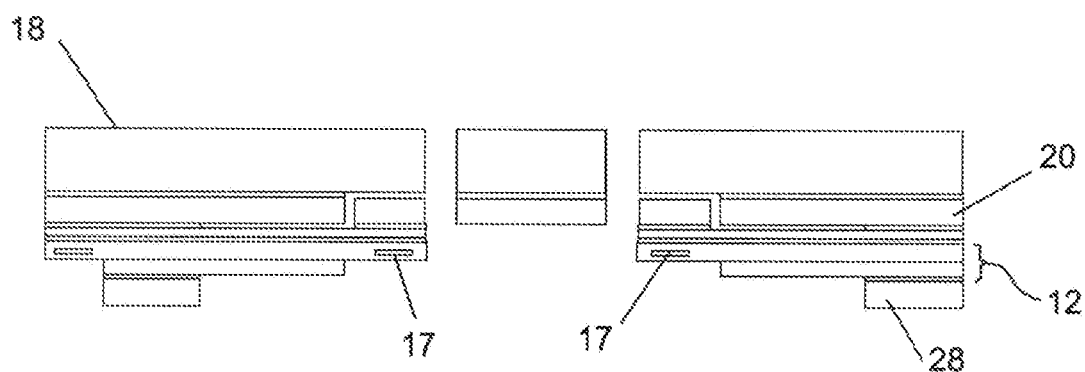
Figure 3E:
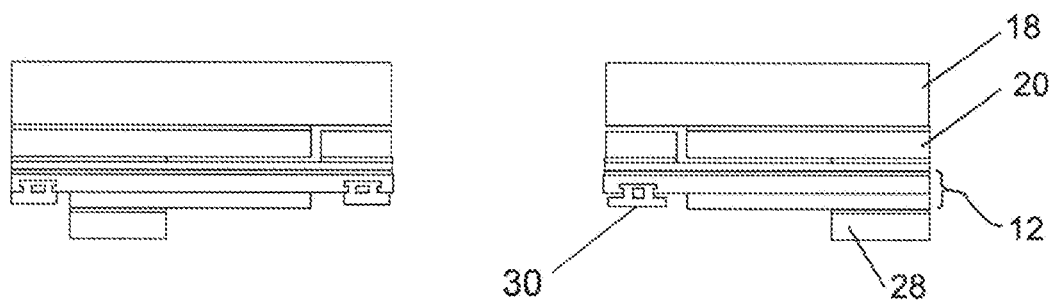

The detailed description explains the preferred embodiments of the invention, together with advantages and features, by way of example with reference to the drawings.

Disclosed herein is a circuit board having a mechanically decoupled opto-mechanical connector for coupling a flexible optical waveguide that is releasably disposed thereon to an opto-electronic subassembly or module. As will be discussed in greater detail below, the flexible optical waveguide includes an end portion that is releasably attached at a position that is close to the optical facet and is equipped with a passively aligned connector. This results in a mechanically decoupled opto-mechanical connector for the waveguide with minimal mechanical stress. Any type of optical element, e.g., active or passive, can be connected to the connector.

FIG. 1 illustrates a partial cross-section of a circuit board 10 that includes a flexible optical waveguide shown generally at 12 having one end 14 adapted to be releasably attached and equipped with a passively aligned connector 16. This results in a mechanically decoupled opto-mechanical connector for the waveguide 12. Any kind of optical element, active or passive, can be connected to this opto-mechanical connector.

The flexible optical waveguide end 14 is disposed in close proximity to an optical facet (not shown) and also includes one or more passive alignment features 17, e.g., a copper marker. The passive alignment feature 17 is utilized to align a mechanical adapter 19, which acts, in combination with the connector 16, as an opto-mechanical connector of the waveguide 12. The printed circuit board (i.e., PCB) includes a relatively rigid upper board 18, which can include various electrical lines including all high frequency lines. Exemplary board materials include, without limitation, FR4 (woven glass fiber bundles in a resin matrix), surface laminated circuitry boards, substrate materials used for organic and inorganic carriers, polyimides, LCP, and the like.

A stiffener board 20 is shown attached to the upper board 18 using a suitable adhesive 22. The stiffener board may or may not include electrical lines depending on the intended application. The flexible optical waveguide 12 is attached to the stiffener board 20 using a suitable adhesive 24 and is supported on a flexible substrate 26 that permits flexure of the flexible optical waveguide 12. A lower board 28 is attached to the existing stack using a suitable adhesive 27. An adapter 30, which can be part of a complex connector, is disposed at the board edge, which may be rigid or flexible depending on the intended application.

FIG. 2 illustrates in greater detail a cross section of an exemplary flexible optical waveguide 12, which is first fabricated as an independent optical layer to enable the desired modularity. The flexible waveguide includes a flexible substrate 40, which contains the alignment markers 46, e.g. copper markers. By way of example, the alignment markers 46 can be structured into the copper layer of a laminated resin coated copper foil 42, which is disposed on the flexible substrate. Exemplary flexible materials are polyimides, FR4, thin layer materials commonly used in PCB manufacturing, e.g., resin coated copper, copper, and the like. Disposed thereon is a patterned core layer 48 encased within cladding layers 44. The flexible optical waveguide is laminated to the PCB.

Figure 4A:
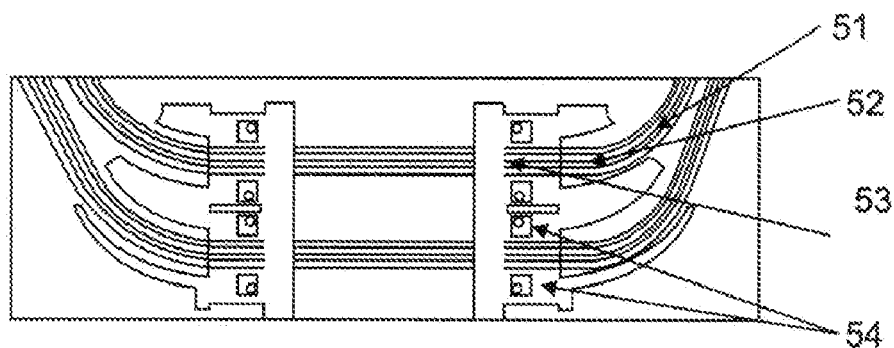
FIG. 4 (A, B) illustrates bottom-up views of the printed circuit board after milling and laser drilling of the alignment features, and after laser cut to provide release of the flexible optical waveguide.
Figure 4B:
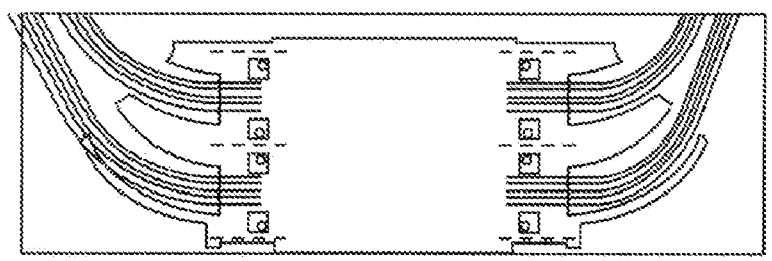
Figure 5:
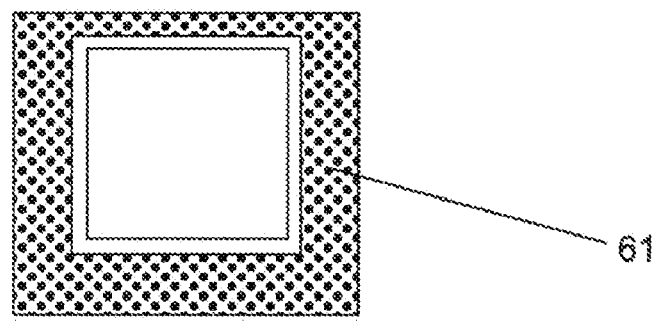
FIG. 5 illustrates top-down view of the printed circuit board after trench milling, optical facet preparation, and flex contour milling.

FIG. 3 (A-E) illustrates an exemplary process for fabricating the flexible optical connector in the printed circuit board (PCB). The process includes local lamination of the stiffener board 20 to the flexible optical waveguide 12. Local lamination may be provided by a structured adhesive tape, bonding film, acrylate adhesive foil, patterned glue, patterned adhesion inhibitor layer, a sacrificial layer or any combination thereof that permits local release as described. The stiffener board 20, which may or may not include electrical lines, is used to partially stiffen the flex, e.g., close to the connector area. Optionally, a metallic stop may be used to provide a stop layer on the stiffener board. The upper electrical board 18 is then laminated to the existing stack containing the flexible optical waveguide and stiffener board. The lower board 28 is then laminated to the existing stack. FIGS. 3, 4 and 5 illustrate the resulting structure after via formation using laser drilling and plating processes along with trench milling, and laser cutting so as to provide optical facet preparation. This is followed by flex contour millings and laser cutting, or the like, to permit flex release of the flexible optical waveguide. Connectors 30 can then be inserted using the passive alignment features 17 in the flexible optical waveguide onto the ends of the flexible optical waveguide and then fixed. An opening is also milled on the top of the board as shown more clearly in FIG. 5.

The adapter can be part of a complex connector. The mechanical adapter provides the alignment features. The MT (mechanical transfer) connector is a standardized optical connector that provides the alignment features. In the case of the mechanical transfer, there are two guiding pins (e.g., 700 micrometers in diameter and 4.6 millimeter center spacing) that are centered with the plane of the optical waveguide array. Subsequent to the assembly of the passively aligned connector; the flexible optical waveguide is locally (close to the optical facet) released. This results in a mechanically decoupled opto-mechanical connector for the waveguides.

Any kind of optical element (active or passive) can be connected to the optic-mechanical connector. By way of example, opto-electronic modules may contain optical transceivers, for example, vertical cavity surface emitting lasers (VCSELs) and photodiodes (PDs), which serve to transmit and receive optical signals, respectively. These modules can reside on/in the PCB, adjacent to/integrated with processors, application specific integrated circuits (ASICs) and memory controllers, whenever dense, high speed optical interconnects are required.

The modularity of the above noted systems given by functional separation of the interfaces provides benefits for designing and the reliability of optical interconnects. Modularity also enables individual improvement of each element, e.g., PCB, OE-subassembly, optics, thermal interfaces, and the like. This approach not only simplifies the assembly process of the OE subassemblies to the PCB but it also advantageously provides increased reliability due to reduced mechanical stress in the interface. Board openings as typically required for opto-electronic subassembly can be optimized to a smaller footprint and increased design freedom. This is especially advantageous for an application where the opto-electronic subassembly is attached below a carrier and therefore protrudes through the board. Accordingly, it is desired to have a relatively high I/O density located close to the opto-electronics subassembly. This will serve to maximize the board area available for electrical connections and enable a high degree of freedom for the electrical design.

Figure 6:
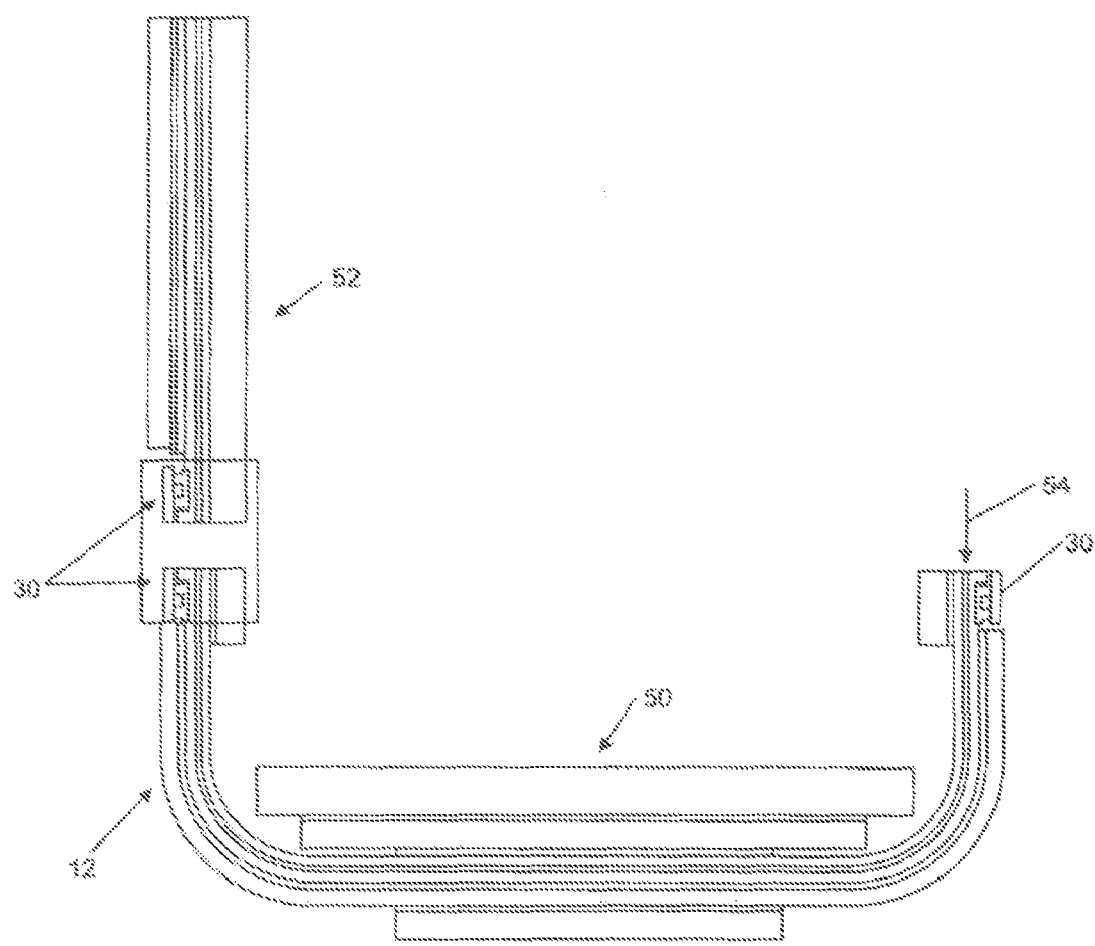
FIG. 6 illustrates a printed circuit board, the backplane, whereby the released, flexible optical waveguide is used to provide a bend in the light path, e.g. a 90° bend. Therefore, an optical connection to the waveguides on the second printed circuit board, the daughter card, is enabled.

An exemplary use of the proposed mechanically decoupled connector is shown in FIG. 6. FIG. 6 illustrates a printed circuit board 50, the backplane, whereby the released, flexible optical waveguide 12 is used to provide a bend in the light path 54, e.g. a 90° bend with respect to the waveguides in the backplane. Therefore, an optical connection to the waveguides on the second printed circuit board 52, i.e., daughter card, is enabled. This bending enables an optical coupling to the waveguides on an additional printed circuit board, i.e., the daughter card.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A printed circuit board including optical interconnects, the printed circuit board comprising:

a rigid substrate;

a flexible optical waveguide locally attached to the rigid substrate having at least one end mechanically decoupled from the rigid substrate such that the one end can be flexed away from the rigid substrate and fitted with a mechanical connector; and an optical facet incorporated in the mechanical connector enabling an optical coupling to the one end mechanically decoupled from the rigid substrate, wherein the rigid substrate consists essentially of a rigid upper board and a partitioned stiffener board partially laminated thereon and permanently attached to the one end of the mechanically decoupled flexible waveguide so as to maintain relative position between individual waveguides and alignment markers.

2. The printed circuit board of claim 1, wherein the flexible waveguide comprises a flexible substrate and one or more layers of optical waveguides.

3. The printed circuit board of claim 1, wherein the flexible waveguide is configured to provide a bend in an optical path and enable a position tolerant connection to an arbitrary oriented component.

* * * * *